(12) United States Patent
Ryu et al.

(10) Patent No.: US 11,825,643 B2
(45) Date of Patent: Nov. 21, 2023

(54) THREE-DIMENSIONAL SEMICONDUCTOR DEVICE WITH AIR GAP

(71) Applicant: SK hynix Inc., Gyeonggi-do (KR)

(72) Inventors: Seung Wook Ryu, Gyeonggi-do (KR); Sung Hun Son, Gyeonggi-do (KR); Ki Hong Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/158,790

(22) Filed: Jan. 26, 2021

(65) Prior Publication Data
US 2022/0013524 A1    Jan. 13, 2022

(30) Foreign Application Priority Data
Jul. 7, 2020    (KR) ........................ 10-2020-0083557

(51) Int. Cl.
*H10B 12/00*      (2023.01)
*H01L 27/13*      (2006.01)

(52) U.S. Cl.
CPC ............. *H10B 12/30* (2023.02); *H01L 27/13* (2013.01)

(58) Field of Classification Search
CPC .... H01L 27/10805; H01L 27/13; H10B 12/30
USPC ....................................................... 257/296
See application file for complete search history.

(56) References Cited

U.S. PATENT DOCUMENTS

| | | | |
|---|---|---|---|
| 2004/0246765 A1* | 12/2004 | Kato ....................... | H01L 27/12 257/E27.111 |
| 2012/0119278 A1* | 5/2012 | Mikasa ............. | H01L 29/66666 257/E29.255 |
| 2014/0043911 A1* | 2/2014 | Samachisa .......... | H01L 27/2409 365/185.18 |
| 2015/0044865 A1* | 2/2015 | Chen ................. | H01L 21/76877 438/618 |
| 2015/0228491 A1* | 8/2015 | Kang ................ | H01L 29/66621 257/330 |
| 2018/0323199 A1* | 11/2018 | Roberts ............. | H01L 27/10882 |
| 2018/0323200 A1 | 11/2018 | Tang et al. | |
| 2019/0164985 A1* | 5/2019 | Lee ................... | H01L 27/10873 |
| 2019/0385897 A1* | 12/2019 | Chandhok ......... | H01L 23/53295 |

FOREIGN PATENT DOCUMENTS

| | | | | |
|---|---|---|---|---|
| EP | 1804293 A1 | * | 7/2007 | ........... H01L 21/764 |
| KR | 101214975 | * | 12/2012 | ......... H01L 41/0926 |

* cited by examiner

*Primary Examiner* — Sheng-Bai Zhu
(74) *Attorney, Agent, or Firm* — IP & T GROUP LLP

(57) ABSTRACT

According to the disclosure, highly integrated memory cells and a semiconductor device having the same are provided. According to an embodiment, a semiconductor device comprises a plurality of memory cells vertically stacked on a base substrate, each of the plurality of memory cells includes, a bit line vertically oriented from the base substrate, a capacitor horizontally spaced apart from the bit line, an active layer horizontally oriented between the bit line and the capacitor, a word line positioned on at least one of a top surface and bottom surface of the active layer and horizontally extending in a direction crossing the active layer, and a capping layer positioned between the word line and the bit line and including, at least, a low-k material and an air gap.

29 Claims, 10 Drawing Sheets

THREE-DIMENSIONAL SEMICONDUCTOR DEVICE WITH AIR GAP

CROSS-REFERENCE TO RELATED APPLICATIONS

The present application claims priority to Korean Patent Application No. 10-2020-0083557, filed on Jul. 7, 2020, which is herein incorporated by reference in its entirety.

BACKGROUND

1. Field

Embodiments of the disclosure relate to semiconductor devices and, more specifically, to memory cells and semiconductor devices including the memory cells.

2. Description of the Related Art

Recently, in order to increase the net die of the memory device, the memory cell has been continuously shrunken.

Although the shrunken memory cell is supposed to lead to a decrease in parasitic capacitance (Cb) and an increase in capacitance, it is hard to increase the net die due to structural limitations to the memory cell.

SUMMARY

According to embodiments of the disclosure, highly integrated memory cells and a semiconductor device having the memory cells are provided.

According to an embodiment, a semiconductor device comprises a plurality of memory cells vertically stacked on a base substrate, each of the plurality of memory cells includes, a bit line vertically oriented from the base substrate, a capacitor horizontally spaced apart from the bit line, an active layer horizontally oriented between the bit line and the capacitor, a word line positioned on at least one of a top surface and bottom surface of the active layer and horizontally extending in a direction crossing the active layer, and a capping layer positioned between the word line and the bit line and including, at least one of a low-k material and an air gap.

According to an embodiment, a semiconductor device comprises a base substrate including a peripheral circuit unit, a bit line vertically oriented from the base substrate, a word line spaced apart from the bit line and the base substrate and horizontally extending in a direction crossing the bit line, and a capping layer including an air gap positioned between the word line and the bit line.

According to an embodiment, a semiconductor device comprises a bit line extending vertically in a first direction from a base substrate, a capacitor spaced apart from the bit line along a second direction parallel to the base substrate, an active layer extending horizontally along the second direction from the bit line to the capacitor, a word line positioned between the bit line and the capacitor and extending horizontally in a third direction while in contact with the active layer, and a capping layer positioned between the word line and the bit line, wherein the capping layer includes a low-k material and an air gap.

The capping layer may include a first silicon oxide layer and a second silicon oxide layer surrounding the first silicon oxide layer. The first silicon oxide layer may include air gap-embedded carbon-doped silicon oxide, and the second silicon oxide layer may include carbon-undoped silicon oxide.

The capping layer may include a silicon oxide layer and a silicon nitride layer surrounding the silicon oxide layer. The silicon oxide layer may include air gap-embedded carbon-doped silicon oxide, and the silicon nitride layer may include carbon-undoped silicon nitride.

According to embodiments of the present disclosure, the capping layer is formed between the bit line and the word lines. Thus, a sufficient physical distance may be secured between the bit line and the word lines.

According to embodiments of the present disclosure, lateral migration of the seam may be suppressed by the liner material. Thus, punching of the word lines may be prevented.

According to embodiments of the present disclosure, a low-k material and an air gap are formed between the bit line and the word lines. Thus, parasitic capacitance between the bit line and the word lines may be reduced.

DETAILED DESCRIPTION

Figure 1A:
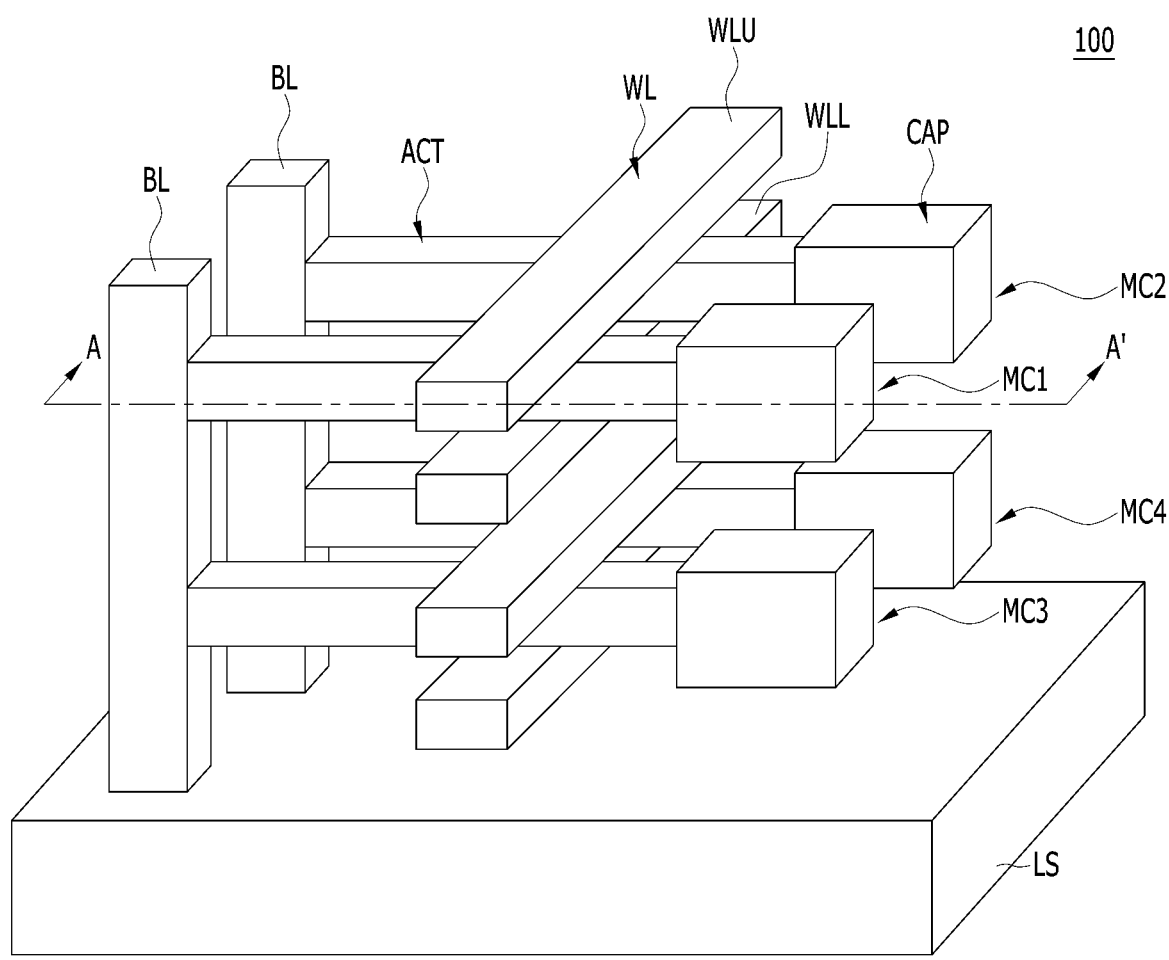
FIG. 1A is a perspective view illustrating a semiconductor device according to an embodiment of the present disclosure.

Hereinafter, embodiments of the present disclosure are described with reference to schematic cross-sectional views, plan views, or block diagrams. Changes or modifications may be made to the views depending on manufacturing techniques and/or tolerances. Thus, embodiments of the disclosure are not limited to specific types as shown and illustrated herein but may rather encompass changes or modifications resultant from fabricating processes. For example, the regions or areas shown in the drawings may be schematically shown, and their shapes shown are provided merely as examples, rather than limiting the category or scope of the disclosure.

According to various embodiments of the present disclosure, it is possible to reduce parasitic capacitance while increasing memory cell density by vertically stacking memory cells.

Figure 1B:
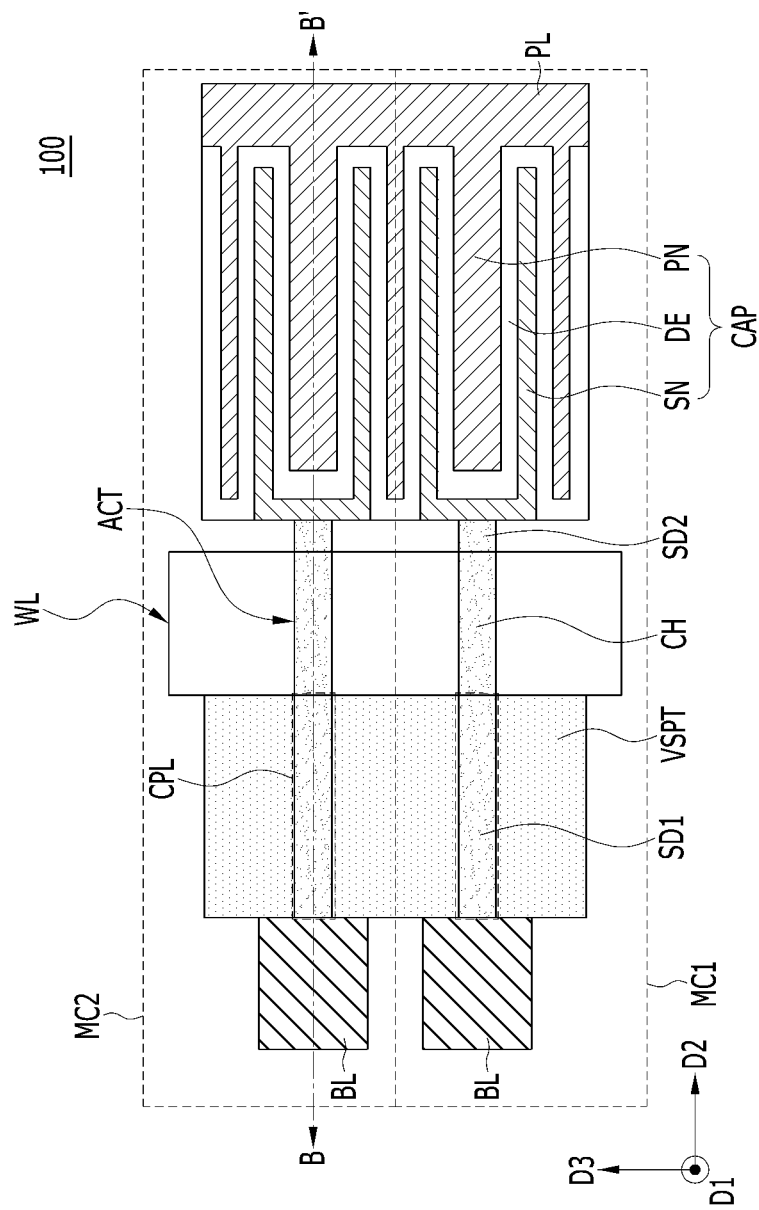
FIG. 1B is a layout taken along line A-A' of FIG. 1A.
Figure 1C:
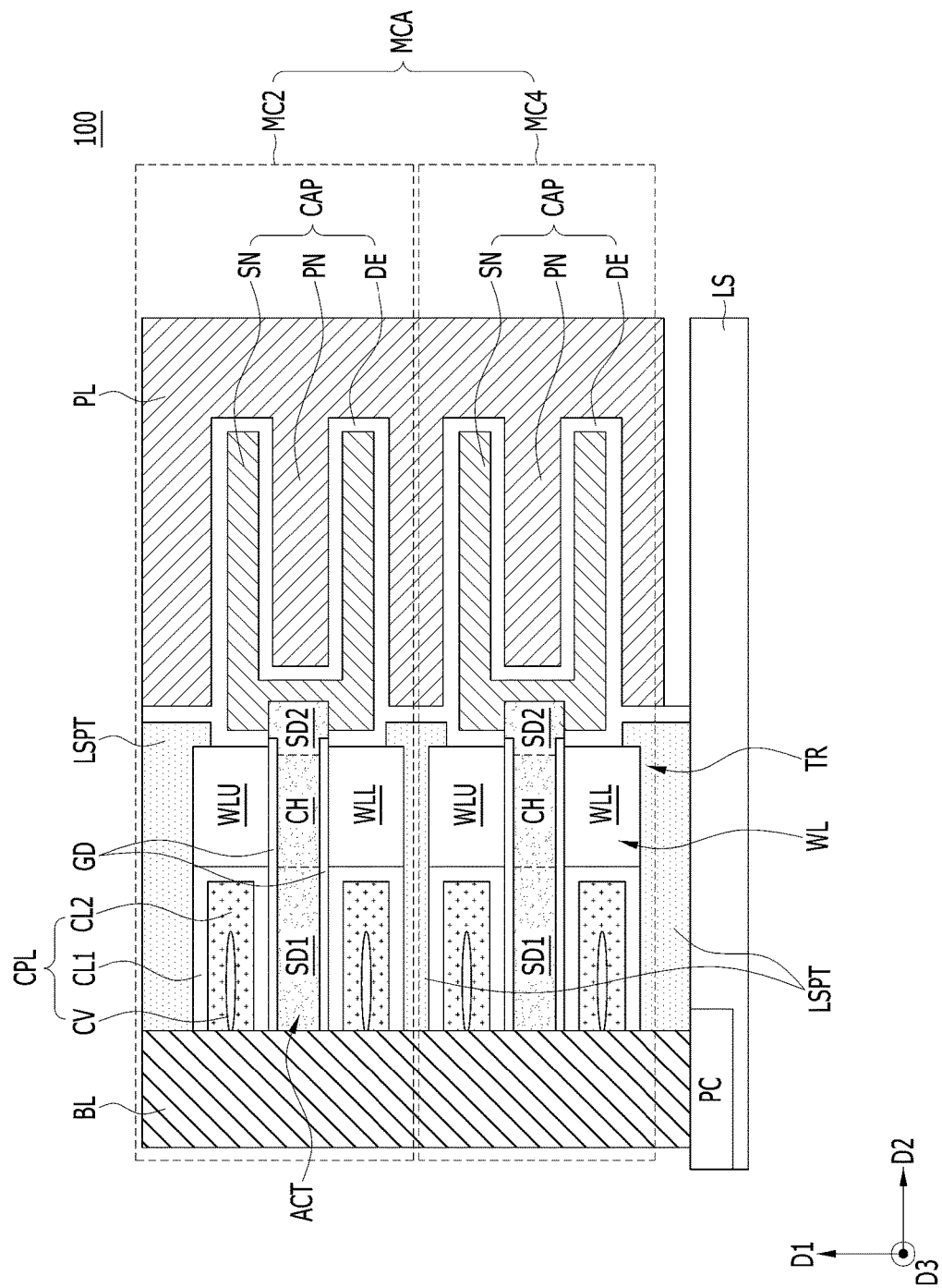
FIG. 1C is a cross-sectional view taken along line B-B' of FIG. 1B.
Figure 1D:
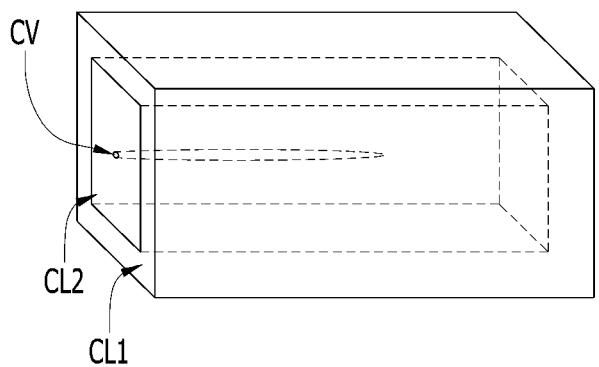
FIG. 1D is a perspective view schematically illustrating a capping layer CPL.

FIG. 1A is a perspective view illustrating a semiconductor device according to an embodiment of the present disclosure. FIG. 1B is a layout taken along line A-A' of FIG. 1A. FIG. 1C is a cross-sectional view taken along line B-B' of FIG. 1B. FIG. 1D is a perspective view schematically illustrating a capping layer CPL.

Referring to FIGS. 1A to 1D, a semiconductor device 100 may include a base substrate LS, and a memory cell array MCA may be formed on the base substrate LS. The memory cell array MCA may be oriented perpendicular to the base substrate LS. The base substrate LS may include a plane, and the memory cell array MCA may be oriented perpendicular to the plane of the base substrate LS. The memory cell array MCA may be vertically oriented upwards along a first direction D1 from the base substrate LS. The memory cell array MCA may include a three-dimensional array of memory cells MC. The memory cell array MCA may include a plurality of memory cells MC1, MC2, MC3, and MC4. For example, the memory cell array MCA may include a first memory cell MC1, a second memory cell MC2, a third memory cell MC3, and a fourth memory cell MC4. The first and third memory cells MC1 and MC3 may be vertically oriented along the first direction D1. The second and fourth memory cells MC2 and MC4 may be vertically oriented along the first direction D1. The first and second memory cells MC1 and MC2 may be horizontally oriented along a third direction D3. The third and fourth memory cells MC3 and MC4 may be horizontally oriented along the third direction D3. The individual memory cells MC1, MC2, MC3, and MC4 of the memory cell array MCA may include a bit line BL, a transistor TR, a capacitor CAP, and a plate line PL. The transistor TR and the capacitor CAP may be horizontally oriented along a second direction D2. The individual memory cells MC1, MC2, MC3, and MC4 may further include a word line WL, and the word line WL may be elongated along the third direction D3. In the individual memory cells MC1, MC2, MC3, and MC4, the bit line BL, the transistor TR, the capacitor CAP, and the plate line PL may be positioned horizontally along the second direction D2. The memory cell array MCA may include a dynamic random-access memory (DRAM) memory cell array. Alternatively, the memory cell array MCA may include a phase-change random access memory (PCRAM), a redox-based random access memory (RERAM), or a magnetoresistive random access memory (MRAM), and the capacitor CAP may be replaced with another memory element.

The base substrate LS may include a material appropriate for semiconductor processing. The base substrate LS may include at least one or more of a conductive material, a dielectric material, and a semiconductive material. Various materials may be formed on the base substrate LS. The base substrate LS may include a semiconductor substrate. The base substrate LS may be formed of a silicon-containing material. The base substrate LS may include silicon, monocrystalline silicon, polysilicon, amorphous silicon, silicon-germanium, monocrystalline silicon-germanium, polycrystalline silicon-germanium, carbon-doped silicon, a combination thereof or a multi-layer structure thereof. The base substrate LS may include other semiconductor material, e.g., germanium. The base substrate LS may include a compound semiconductor substrate, e.g., a group-III/V semiconductor substrate, such as of GaAs. The base substrate LS may include a silicon-on-insulator (SOI) substrate.

According to an embodiment, the base substrate LS may include a peripheral circuit unit PC. The peripheral circuit unit PC may include a plurality of control circuits for controlling the memory cell array MCA. At least one or more control circuits of the peripheral circuit unit PC may include an N-channel transistor, a P-channel transistor, a complementary metal-oxide-semiconductor (CMOS) circuit, or a combination thereof. At least one or more control circuits of the peripheral circuit unit PC may include, e.g., an address decoder circuit, a read circuit, and a write circuit. At least one or more control circuits of the peripheral circuit unit PC may include, e.g., a planar channel transistor, a recess channel transistor, a buried gate transistor, or a fin channel transistor (FinFET).

For example, at least one control circuit of the peripheral circuit unit PC may be electrically connected to the bit line BL. The peripheral circuit unit PC may include a sense amplifier (SA), and the sense amplifier (SA) may be electrically connected to the bit line BL. Although not shown, a multi-level metal wire MLM may be positioned between the memory cell array MCA and the base substrate LS, and the peripheral circuit unit PC and the bit line BL may be interconnected via the multi-level metal wire MLM.

The memory cell array MCA may include a stack of at least two or more memory cells MC. At least two or more memory cells MC may be vertically stacked on the base substrate LS along the first direction D1.

The bit line BL may extend from the base substrate LS along the first direction D1. The plane of the base substrate LS may extend along the second direction D2 and the third direction D3. The first direction D1 may be perpendicular to the second direction D2. The bit line BL may be vertically oriented from the base substrate LS. A bottom portion of the bit line BL may be connected to the base substrate LS. The bottom portion of the bit line BL may be connected to the peripheral circuit unit PC. The bit line BL may have a pillar shape. The bit line BL may be denoted a vertically oriented bit line or pillar-shaped bit line. The bit line BL may include a conductive material. The bit line BL may include a silicon-based material, a metal-based material, or a combination thereof. The bit line BL may include polysilicon, metal, metal nitride, metal silicide, or a combination thereof. Memory cells MC vertically stacked in the same line may share one bit line BL. The bit line BL may include polysilicon, titanium nitride, tungsten, or a combination thereof. For example, the bit line BL may include polysilicon or titanium nitride (TiN) doped with N-type impurities. The bit line BL may include a stack (TiN/W) of titanium nitride and tungsten. The bit line BL may further include an ohmic contact, such as an ohmic contact made of a metal silicide.

The transistors TR may be arranged along the second direction D2 parallel with the surface of the base substrate LS. The transistors TR may be horizontally arranged. For example, the transistor TR may be horizontally positioned between the bit line BL and the capacitor CAP. The transistor TR may be positioned at a higher level than the base substrate LS, and the transistor and the base substrate LS may be spaced apart from each other.

The transistor TR may include an active layer ACT, a gate dielectric layer GD, and a word line WL. The word line WL may extend along the third direction D3, and the active layer ACT may extend along the second direction D2. The third direction D3 may be perpendicular to the first direction D1. The active layers ACT may be horizontally arranged from the bit line BL. The active layer ACT may be oriented in parallel with the plane of the base substrate LS.

The word line WL may have a double word line structure positioned with the active layer ACT interposed therebetween. The gate dielectric layer GD may be formed on each of the top and bottom surfaces of the active layer ACT. The word line WL may include an upper word line WLU and a lower word line WLL. The upper word line WLU may be disposed on the top surface of the active layer ACT, and lower word line WLL may be disposed under the bottom surface of the active layer ACT. The gate dielectric layer GD may be formed between the upper word line WLU and the top surface of the active layer ACT, (also referred to as an upper gate dielectric layer). The gate dielectric layer GD may also be formed between the lower word line WLL and the bottom surface of the active layer ACT (also referred to as a lower gate dielectric layer). The upper word line WLU and the lower word line WLL may be spaced apart from the active layer ACT by the respective upper and lower gate dielectric layers GD.

The gate dielectric layer GD may include silicon oxide, silicon nitride, metal oxide, metal oxynitride, metal silicate, a high-k material, a ferroelectric material, an anti-ferroelectric material, or a combination thereof. The gate dielectric layer GD may include, e.g., $SiO_2$, $Si_3N_4$, $HfO_2$, $Al_2O_3$, $ZrO_2$, AlON, HfON, HfSiO, or HfSiON.

The word line WL may include a metal, a metal mixture, a metal alloy, or a semiconductor material. The word line WL may include titanium nitride, tungsten, polysilicon, or a combination thereof. For example, the word line WL may include a TiN/W stack of titanium nitride and tungsten. The word line WL may include an N-type work function material or a P-type work function material. The N-type work function material may have a low work function of 4.5 or less, and the P-type work function material may include a high work function of 4.5 or more.

The upper word line WLU and the lower word line WLL may have different potentials. For example, in the individual memory cells MC1, MC2, MC3, and MC4, a word line driving voltage may be applied to the upper word line WLU, and a ground voltage may be applied to the lower word line WLL. The lower word line WLL may block interference of the upper word lines WLU between the memory cells MC positioned vertically along the first direction D1. Alternatively, a ground voltage may be applied to the upper word line WLU, and a word line driving voltage may be applied to the lower word line WLL. According to an embodiment, the upper word line WLU and the lower word line WLL may be connected to each other by a contact plug (not shown).

The active layer ACT may include a semiconductor material, such as polysilicon. The active layer ACT may include a plurality of impurity areas. The impurity areas may include a first source/drain region SD1 and a second source/drain region SD2. The active layer ACT may include polysilicon, undoped polysilicon, amorphous silicon, or an oxide semiconductor material. The first source/drain region SD1 and the second source/drain region SD2 may be doped with N-type impurities or P-type impurities. The first source/drain region SD1 and the second source/drain region SD2 may be doped with the same conductive-type impurities. The first source/drain region SD1 and the second source/drain region SD2 may be doped with the same conductivity-type impurities. The first source/drain region SD1 and the second source/drain region SD2 may be doped with P-type impurities. The first source/drain region SD1 and the second source/drain region SD2 may include impurities of at least any one selected from among arsenic (As), phosphorus (P), boron (B), indium (In), and a combination thereof. The bit line BL may be electrically connected to a first edge portion of the active layer ACT, and the capacitor CAP may be electrically connected to a second edge portion of the active layer ACT. The first edge portion of the active layer ACT may be provided by the first source/drain region SD1, and the second edge portion of the active layer ACT may be provided by the second source/drain region SD2. The active layer ACT may further include a channel CH. The channel CH may be defined between the first source/drain region SD1 and the second source/drain region SD2. The upper word line WLU and the lower word line WLL may face each other, with the channel CH disposed therebetween.

The active layers ACT neighboring along the third direction D3 may be supported by a vertical support VSPT. The vertical support VSPT may vertically extend along the first direction D1. The vertical support VSPT may be positioned between the memory cells MC neighboring along the third direction D3. The vertical support VSPT may include a separation layer to separate the active layers ACT positioned along the third direction D3 from each other.

A horizontal support LSPT may be positioned between the memory cells MC neighboring along the first direction D1. The horizontal support LSPT may be positioned between the lower word line WLL of an upper memory cell MC and the upper word line WLU of a lower memory cell MC. The horizontal support LSPT may not be positioned between capacitors CAP neighboring along the first direction D1.

The vertical support VSPT and the horizontal support LSPT may include the same material. The vertical support VSPT and the horizontal support LSPT may include an insulation material, such as silicon oxide.

The capacitor CAP may be horizontally disposed from the transistor TR. The capacitor CAP may horizontally extend from the active layer ACT along the second direction D2. The capacitor CAP may include a storage node SN, a dielectric layer DE, and a plate node PN. The storage node SN, the dielectric layer DE, and the plate node PN may be horizontally arranged along the second direction D2. The storage node SN may have a cylinder shape horizontally oriented, and the plate node PN be shaped to extend over a cylinder inner wall and cylinder outer wall of the storage node SN. The dielectric layer DE may surround the plate node PN and be positioned inside the storage node SN. The plate node PN may connect to the plate line PL. In other words, each plate node may be extending from the plate line PL inside a corresponding storage node SN with the dielectric layer DE separating the plate node PN from the interior surfaces of the storage node SN. The storage node SN may be electrically connected to the second source/drain region SD2. A portion of the second source/drain region SD2 may extend to the inside of the storage node SN.

The capacitor CAP may include a metal-insulator-metal (MIM) capacitor. The storage node SN and the plate node PN may include a metal-based material. The dielectric layer DE may include silicon oxide, silicon nitride, a high-k material, or a combination thereof. The high-k material may have a higher dielectric constant than silicon oxide. The silicon oxide ($SiO_2$) may have a dielectric constant of about 3.9, and the dielectric layer DE may include a high-k material having a dielectric constant of 4 or more. The high-k material may have a dielectric constant of about 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). Alternatively, the dielectric layer DE may be formed of a composite layer which includes two or more layers of the high-k materials mentioned above.

The dielectric layer DE may be formed of a zirconium-based oxide (Zr-based oxide). The dielectric layer DE may have a stacked structure including a zirconium oxide ($ZrO_2$). The stacked structure including the zirconium oxide ($ZrO_2$) may include a ZA($ZrO_2/Al_2O_3$) stack or a ZAZ($ZrO_2/Al_2O_3/ZrO_2$) stack. The ZA stack may have a stacked structure in which an aluminum oxide $Al_2O_3$ is stacked on a zirconium oxide $ZrO_2$. The ZAZ stack may have a stacked structure in which a zirconium oxide $ZrO_2$, an aluminum oxide $Al_2O_3$, and a zirconium oxide $ZrO_2$ are sequentially stacked. The ZA stack and ZAZ stack may be denoted as a zirconium oxide-base layer ($ZrO_2$-based layer). According to another embodiment, the dielectric layer DE may form a hafnium-based oxide. The dielectric layer DE may have a stacked structure including a hafnium oxide ($HfO_2$). The stacked structure including the hafnium oxide ($HfO_2$) may include a HA($HfO_2/Al_2O_3$) stack or an HAH($HfO_2/Al_2O_3/HfO_2$) stack. The HA stack may have a stacked structure in which an aluminum oxide $Al_2O_3$ is stacked on a hafnium oxide $HfO_2$. The HAH stack may have a stacked structure in which a hafnium oxide $HfO_2$, an aluminum oxide $Al_2O_3$, and a hafnium oxide $HfO_2$ are sequentially stacked. The HA stack and HAH stack may be denoted as a hafnium oxide-base layer ($HfO_2$-based layer). In the ZA stack, ZAZ stack, HA stack, and HAH stack, the aluminum oxide ($Al_2O_3$) may have a larger bandgap than the zirconium oxide ($ZrO_2$) and the hafnium oxide ($HfO_2$). The aluminum oxide ($Al_2O_3$) may have a lower dielectric constant than the zirconium oxide ($ZrO_2$) and the hafnium oxide ($HfO_2$). Thus, the dielectric layer DE may include a stack of the high-k material and a high band gap material which has a larger band gap than the high-k material. The dielectric layer DE may also include a silicon oxide $SiO_2$ as a high band gap material other than the aluminum oxide $Al_2O_3$. As the dielectric layer DE includes a high band gap material, leakage current may be suppressed. The high band gap material may be extremely thin. The high band gap material may have a thickness of about 10 nm or less. The high band gap material may be thinner than the high-k material. According to another embodiment, the dielectric layer DE may include a laminated structure in which high-k materials and high band gap materials are alternately stacked. For example, the dielectric layer DE may include ZAZA($ZrO_2/Al_2O_3/ZrO_2/Al_2O_3$), ZAZAZ($ZrO_2/Al_2O_3/ZrO_2/Al_2O_3/ZrO_2$), HAHA($HfO_2/Al_2O_3/HfO_2/Al_2O_3$) or HAHAH ($HfO_2/Al_2O_3/HfO_2/Al_2O_3/HfO_2$). In the above laminated structure, the aluminum oxide $Al_2O_3$ may be extremely thin.

According to another embodiment, the dielectric layer DE may include a stacked structure, laminated structure, or mixing structure including zirconium oxide, hafnium oxide, and aluminum oxide.

According to another embodiment, an interface control layer (not shown) may further be formed between the storage node SN and the dielectric layer DE to mitigate leakage current. The interface control layer may include titanium oxide ($TiO_2$). The interface control layer may also be formed between the plate node PN and the dielectric layer DE.

The storage node SN and the plate node PN may include a metal, precious metal, metal nitride, conductive metal oxide, conductive precious metal oxide, metal carbide, metal silicide, or a combination thereof. For example, the storage node (SN) and the plate node (PN) may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium oxide ($IrO_2$), platinum (Pt), molybdenum (Mo), molybdenum oxide (MoO), titanium nitride/tungsten (TiN/W) stack, or tungsten nitride/tungsten (WN/W). The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, the silicon germanium may be a gap-fill material filling the cylinder of the storage node SN, the titanium nitride (TiN) may substantially play a role as a plate node of the capacitor CAP, and the tungsten nitride may be a low-resistance material. The bottom portion of the plate line PL may be insulated from the base substrate LS.

The storage node SN may have a three-dimensional (3D) structure, and the 3D structure of the storage node SN may be a 3D structure oriented along the second direction D2. As an example of the 3D structure, the storage node SN may have a cylinder shape, a pillar shape, or a pylinder shape resultant from merging a pillar shape and a cylinder shape.

A portion of the dielectric layer DE may be positioned between the word line WL and the storage node SN.

Referring back to FIGS. 1B to 1D, a capping layer CPL may be positioned between the bit line BL and the word line WL. The capping layer CPL may be horizontally oriented along the second direction D2 between the bit line BL and the word line WL. A horizontal support LSPT may be positioned between capping layers CPL neighboring along the first direction D1 (refer to FIG. 1C). A vertical support VSPT may be positioned between capping layers CPL neighboring along the third direction D3 (refer to FIG. 1B). The height of the capping layer CPL may be identical to the height of the word line WL. The capping layer CPL may include a separation layer that separates the active layers ACT neighboring along the first direction D1. The active layers ACT neighboring along the first direction D1 and the third direction D3 may be separated by the vertical support VSPT and the capping layer CPL. The capping layer CPL and the word line WL may have the same or different widths along the second direction D2. The capping layer CPL and the first source/drain region SD1 may overlap each other vertically along the first direction D1. The capping layer CPL and the first source/drain region SD1 may be insulated from each other by the gate dielectric layer GD.

The capping layer CPL may be positioned at the same level as the word line WL. A first side surface of the capping layer CPL may directly contact the bit line BL, and a second side surface of the capping layer CPL may directly contact the word line WL. Each of the first and second side surfaces of the capping layer CPL may include a vertical side wall. The first side surface of the capping layer CPL may be formed of different materials. The second side surface of the capping layer CPL may be formed of only one material. The capping layer CPL may electrically separate the bit line BL and the word line WL from each other. The capping layer CPL may have a low dielectric constant (low-k) to be able to reduce the parasitic capacitance between the bit line BL and the word line WL. The capping layer CPL may include a low-k material capable of reducing the parasitic capacitance between the bit line BL and the word line WL. The capping layer CPL may include the same or different material from the vertical support VSPT and horizontal support LSPT. A portion of the capping layer CPL may have an etch selectivity to the vertical support VSPT and the horizontal support LSPT.

The capping layer CPL may be positioned between the word line WL and the bit line BL and may include, at least, a low-k material and a seam SV. The capping layer CPL may include a plurality of liner materials. For example, the capping layer CPL may include a first liner material CL1 and a second liner material CL2. The first liner material CL1 may include a conformal material, and the second liner material CL2 may include a non-conformal material. The first liner material CL1 and the second liner material CL2 may be different materials. The first liner material CL1 and the second liner material CL2 may have different etch selectivities. The second liner material CL2 may function as an etch stop layer during an etching process on the first liner material CL1. The first liner material CL1 may be positioned between the bit line BL and the word line WL, and the second liner material CL2 may be embedded in the first liner material CL1. The first liner material CL1 may surround a portion of the second liner material CL2. The first liner material CL1 may have a cylinder shape, and the cylinder of the first liner material CL1 may be filled with the second liner material CL2. The second liner material CL2 may contact the bit line BL but may not contact the word line WL. The second liner material CL2 may be partially surrounded by the first liner material CL1. The second liner material CL2 may include a low-k material embedded in the first liner material CL1.

The first liner material CL1 may include an oxide-based material, and the second liner material CL2 may include a material with an etch selectivity to the oxide-based material. The second liner material CL2 may be a material with a larger etch selectivity to silicon oxide than conventional silicon nitride, e.g., $Si_3N_4$. The etch selectivity between the first liner material CL1 and the second liner material CL2 may be obtained by a dopant, and the dopant may include, e.g., carbon. The carbon-doped second liner material CL2 may have an etch selectivity to the carbon-undoped first liner material CL1.

The first liner material CL1 may include a nitride-based material, and the second liner material CL2 may include a material with a large etch selectivity to the nitride-based material. The first liner material CL1 may include carbon-undoped silicon nitride, and the second liner material CL2 may include carbon-doped silicon nitride or carbon-doped silicon oxide. The carbon-doped silicon nitride may have an etch selectivity to the carbon-undoped silicon nitride and carbon-undoped silicon oxide.

The first liner material CL1 may include silicon oxide or silicon nitride, and the second liner material CL2 may contain, at least, carbon. The second liner material CL2 may include a carbon-doped material, and the first liner material CL1 may include a carbon-undoped material. The first liner material CL1 may include carbon-undoped silicon oxide or carbon-undoped silicon nitride. The second liner material CL2 may include carbon-doped silicon, carbon-doped silicon nitride, or carbon-doped silicon oxide. According to an embodiment, the second liner material CL2 may include a low-k material such as, for example, silicon carbide, silicon carbon nitride (SiCN), or silicon carbon oxide (SiCO). In an embodiment, the second liner material CL2 may have a dielectric constant of about 3.5 or less.

The second liner material CL2 may include a seam CV or a void. The rest of the second liner material CL2 except for the seam SV may be referred to as a gap-fill portion (or bulk portion). The gap-fill portion may include no seam CV or void, i.e., the gap-fill portion may be seam-free. The seam CV of the second liner material CL2 may be positioned to be physically spaced apart from the upper word lines WLU and the lower word lines WLL. The seam CV may directly contact the bit line BL. The seam CV, the second liner material CL2, and the first liner material CL1 may be positioned between the bit line BL and the upper word line WLU. According to an embodiment, the second liner material CL2 may be seam-free. According to an embodiment, the second liner material CL2 may include a small seam which is smaller in size than the seam CV.

As described above, the bit line BL and upper/lower word lines WLU and WLL may be physically spaced apart from each other by the capping layer CPL. A sufficient physical distance may be secured between the seam CV and upper/lower word lines WLU and WLL by the second liner material CL2. Since the lateral migration of the seam CV along the second direction D2 is suppressed by the second liner material CL2, punching of the upper/lower word lines WLU and WLL may be prevented.

According to an embodiment, the seam CV may remain an embedded air gap. Thus, the capping layer CPL may include the first liner material CL1 and the second liner material CL2, and the second liner material CL2 may include the low-k material and the air gap embedded in the first liner material CL1. Since the capping layer CPL includes the embedded air gap, the parasitic capacitance between the bit line BL and the upper/lower word lines WLU and WLL may be reduced. Since the second liner material CL2 includes the low-k material, the parasitic capacitance between the bit line BL and the upper/lower word lines WLU and WLL may further be reduced.

The first liner material CL1 may be thinner than the second liner material CL2. In the capping layer CPL, the second liner material CL2 may be larger in volume than the first liner material CL1. Resultantly, since the second liner material CL2 having the embedded air gap and lower dielectric constant has a relatively large volume, the parasitic capacitance between the bit line BL and the upper/lower word lines WLU and WLL may further be decreased.

Various modifications may be made to the capping layer CPL as described below.

The capping layer CPL may include a first silicon oxide layer and a second silicon oxide layer surrounding the first silicon oxide layer. The first silicon oxide layer may include carbon-doped silicon oxide, and the second silicon oxide layer may include carbon-undoped silicon oxide. The second silicon oxide layer may correspond to the first liner material CL1, and the second silicon oxide layer may correspond to the second liner material CL2. For example, the first silicon oxide layer may include SiCO, and the second silicon oxide layer may include $SiO_2$.

According to an embodiment, the capping layer CPL may include a silicon oxide layer and a silicon nitride layer surrounding the silicon oxide layer. The silicon oxide layer may include carbon-doped silicon oxide, and the silicon nitride layer may include carbon-undoped silicon nitride. The silicon nitride layer may correspond to the first liner material CL1, and the silicon oxide layer may correspond to the second liner material CL2. For example, the silicon oxide layer may include SiCO, and the silicon nitride layer may include $Si_3N_4$.

According to an embodiment, the capping layer CPL may include a silicon nitride layer and a silicon oxide layer surrounding the silicon nitride layer. The silicon nitride layer may include carbon-doped silicon nitride, and the silicon oxide layer may include carbon-undoped silicon oxide. The silicon oxide layer may correspond to the first liner material CL1, and the silicon nitride layer may correspond to the second liner material CL2. For example, the silicon nitride layer may include SiCN, and the silicon oxide layer may include $SiO_2$.

According to an embodiment, the capping layer CPL may include a first silicon nitride layer and a second silicon nitride layer surrounding the first silicon nitride layer. The first silicon nitride layer may include air gap-embedded, carbon-doped silicon nitride (i.e., carbon-doped silicon nitride including an embedded air gap). The second silicon nitride layer may include carbon-undoped silicon nitride. The second silicon nitride layer may correspond to the first liner material CL1, and the first silicon nitride layer may correspond to the second liner material CL2. For example, the first silicon nitride layer may include SiCN, and the second silicon nitride layer may include $Si_3N_4$.

According to an embodiment, the position or material of the first liner material CL1 and the second liner material CL2 may be varied. For example, the first liner material CL1 may include a carbon-doped material with a low dielectric constant, and the second liner material CL2 may include silicon oxide. In this case, the first liner material CL1 may include carbon-doped silicon, carbon-doped silicon nitride or carbon-doped silicon oxide, silicon carbide (SiC), silicon carbon nitride (SiCN), or silicon carbon oxide (SiCO). Although the second liner material CL2 may include a seam CV, migration of the seam CV may be blocked by the first liner material CL1. The first liner material CL1 may be thicker than the second liner material CL2, and the first liner material CL1 may be larger in volume than the second liner material CL2. The second liner material CL2 may include an embedded air gap.

Figure 2:
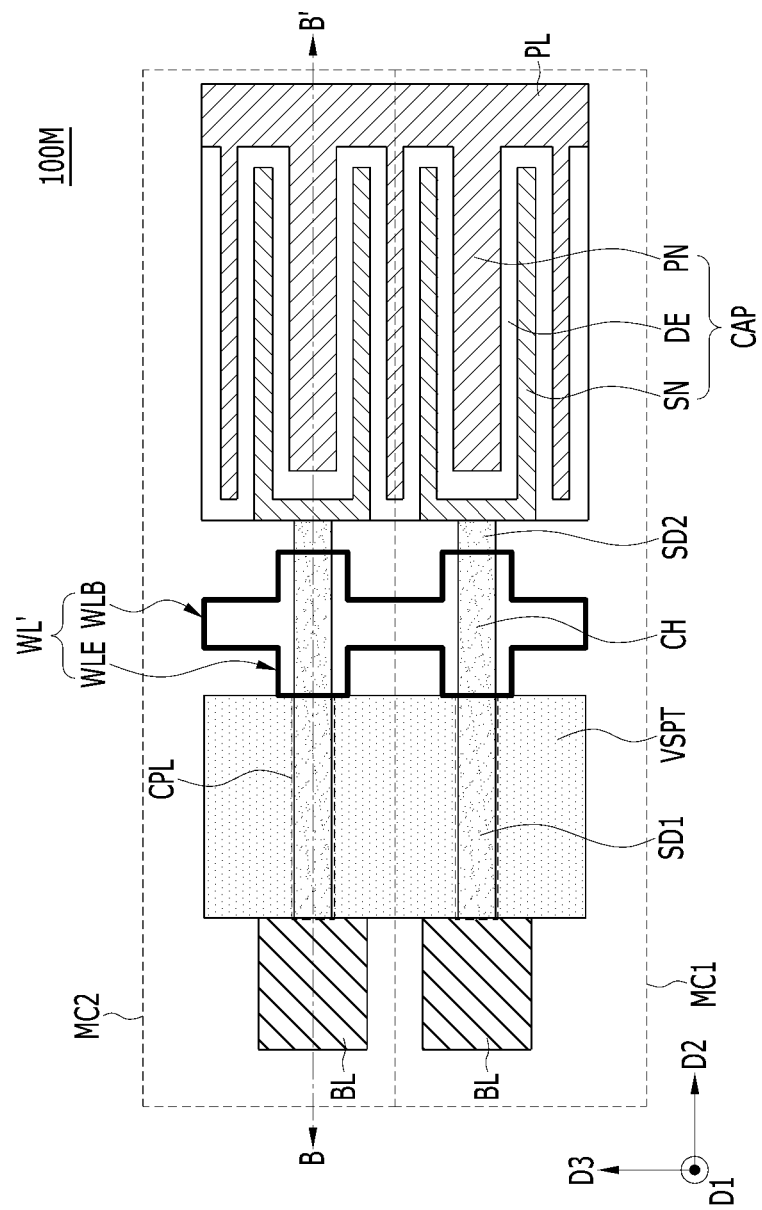
FIG. 2 is a layout view of a semiconductor device according to an embodiment of the present disclosure.

FIG. 2 is a layout view of a semiconductor device according to an embodiment of the present disclosure. In FIG. 2, the same reference numbers are used to denote the same elements as those in FIGS. 1A to 1D. A semiconductor device 100M may be similar to the semiconductor device 100 of FIGS. 1A to 1D. No detailed description is given for duplicate elements. FIG. 2 illustrates a layout view of the semiconductor device 100M, taken along line A-A' of FIG. 1A, similar to the layout view of FIG. 1B.

Referring to FIG. 2, the semiconductor device 100M may include a bit line BL, an active layer ACT, a word line WL', a capacitor CAP, and a plate line PL. The bit line BL may be vertically oriented along the first direction D1, and the active layer ACT may be horizontally oriented along the second direction D2 from the bit line BL. The word line WL' may be horizontally oriented along the third direction D3 crossing the active layer ACT. A capping layer CPL may be positioned between the bit line BL and the word line WL'. A vertical support VSPT may be positioned between active layers ACT neighboring along the third direction D3. Although not shown, like in FIG. 1C, a horizontal support LSPT may be positioned between capping layers CPL neighboring along the first direction D1. The active layer ACT may include a channel CH and, a first source/drain region SD1 and a second source/drain region SD2 on both sides of the channel CH. The capacitor CAP may include a storage node SN, a dielectric layer DE, and a plate node PN.

The word line WL' may include a body portion WLB crossing the neighboring active layers ACT and an extension portion WLE horizontally extending from the body portion WLB. The body portion WLB may extend along the third direction D3, and the extension portion WLE may extend along the second direction D2. The extension portion WLE may horizontally protrude from both side surfaces of the body portion WLB to the capping layer CPL and the storage node SN. The word line WL' may have a cross shape.

The width of the body portion WLB along the second direction D2 may be smaller than the width of the word line WL of FIG. 1B.

Figure 3:
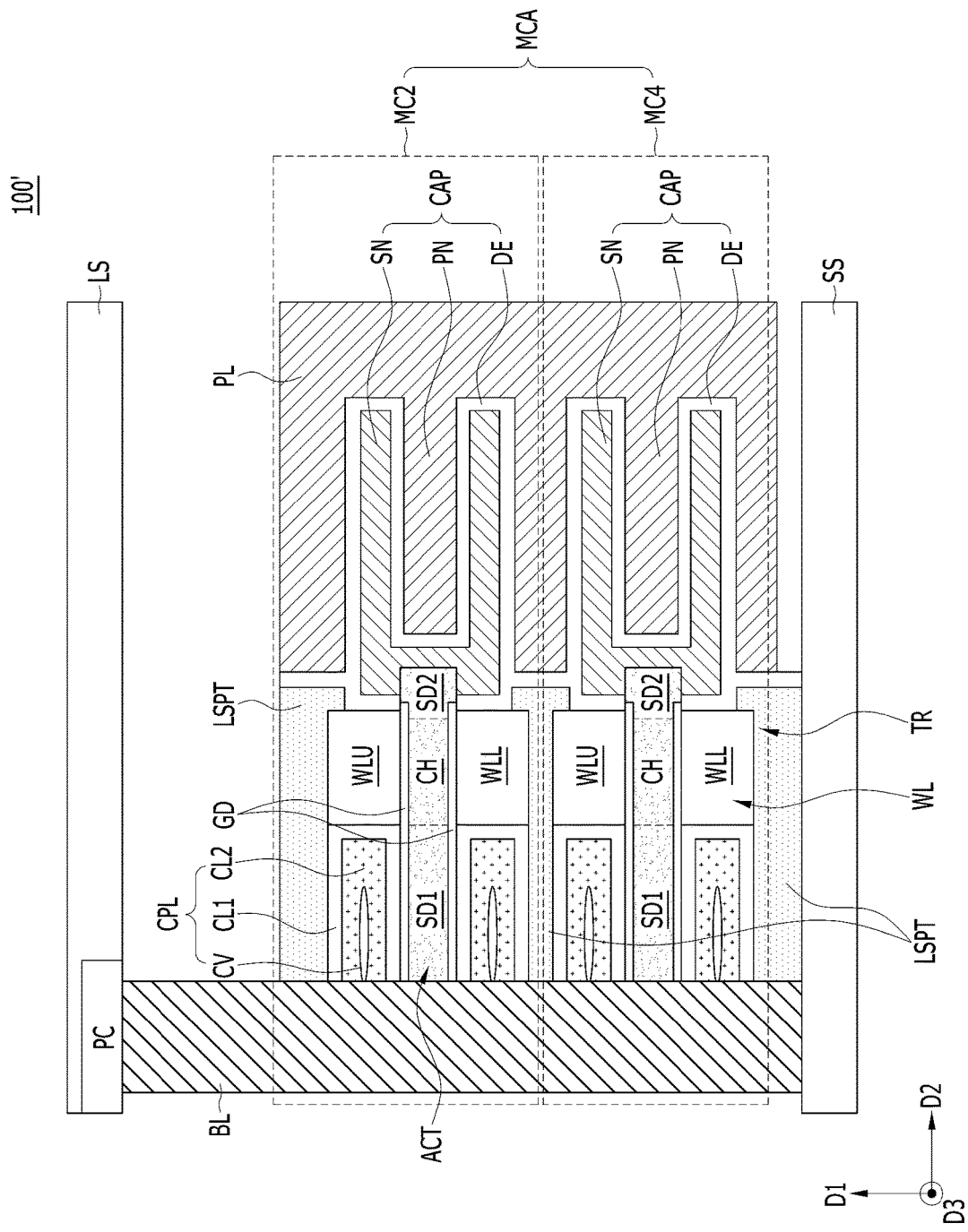
FIG. 3 is a view illustrating a semiconductor device according to an embodiment of the present disclosure.

FIG. 3 is a view illustrating a semiconductor device according to an embodiment of the present disclosure. In FIG. 3, the same reference numbers are used to denote the same elements as those in FIGS. 1A to 1D. Referring to FIG. 3, a semiconductor device 100' may be similar to the semiconductor device 100 of FIGS. 1A to 1D. No detailed description is given for duplicate elements. FIG. 3 is a cross-sectional view of the semiconductor device 100', taken along line B-B' of FIG. 1B, similar to the layout view of FIG. 1C.

The semiconductor device 100' may include a base substrate LS. A memory cell array MCA may be formed under the base substrate LS. The memory cell array MCA may be vertically oriented downwards from the base substrate LS along the first direction D1. The memory cell array MCA may include a plurality of memory cells MC, and the memory cells MC may be vertically oriented along the first direction D1. The individual memory cells MC1, MC2, MC3, and MC4 may include a bit line BL, a transistor TR, a capacitor CAP, and a plate line PL. The transistor TR and the capacitor CAP may be horizontally oriented along a second direction D2. The individual memory cells MC1, MC2, MC3, and MC4 may further include a word line WL. The word line WL may be elongated along the third direction D3. In the individual memory cells MC1, MC2, MC3, and MC4, the bit line BL, the transistor TR, the capacitor CAP, and the plate line PL may be positioned horizontally along the second direction D2. The memory cell array MCA may include a dynamic random access memory (DRAM) memory cell array.

The memory cell array MCA may include a stack of at least two or more memory cells MC. The memory cells MC may be vertically stacked on a supporting substrate SS along the first direction D1. The bit line BL may be connected to the supporting substrate SS.

The supporting substrate SS may include the same material as the base substrate LS. The supporting substrate SS may include a semiconductor substrate, a metal, a conductive material, an insulation material, or a combination thereof.

Figure 4A:
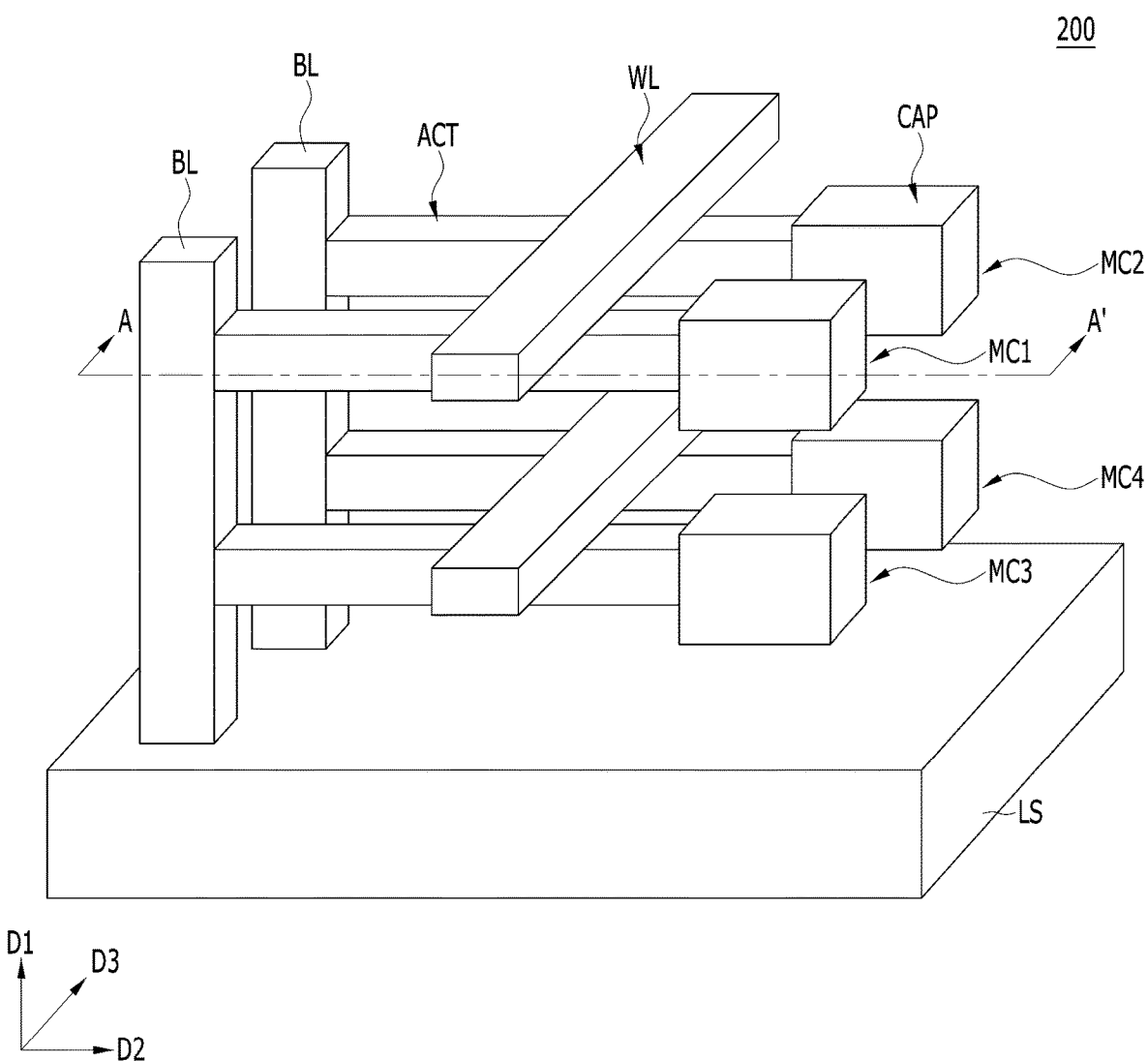
FIGS. 4A and 4B are views illustrating a semiconductor device according to an embodiment of the present disclosure.
Figure 4B:
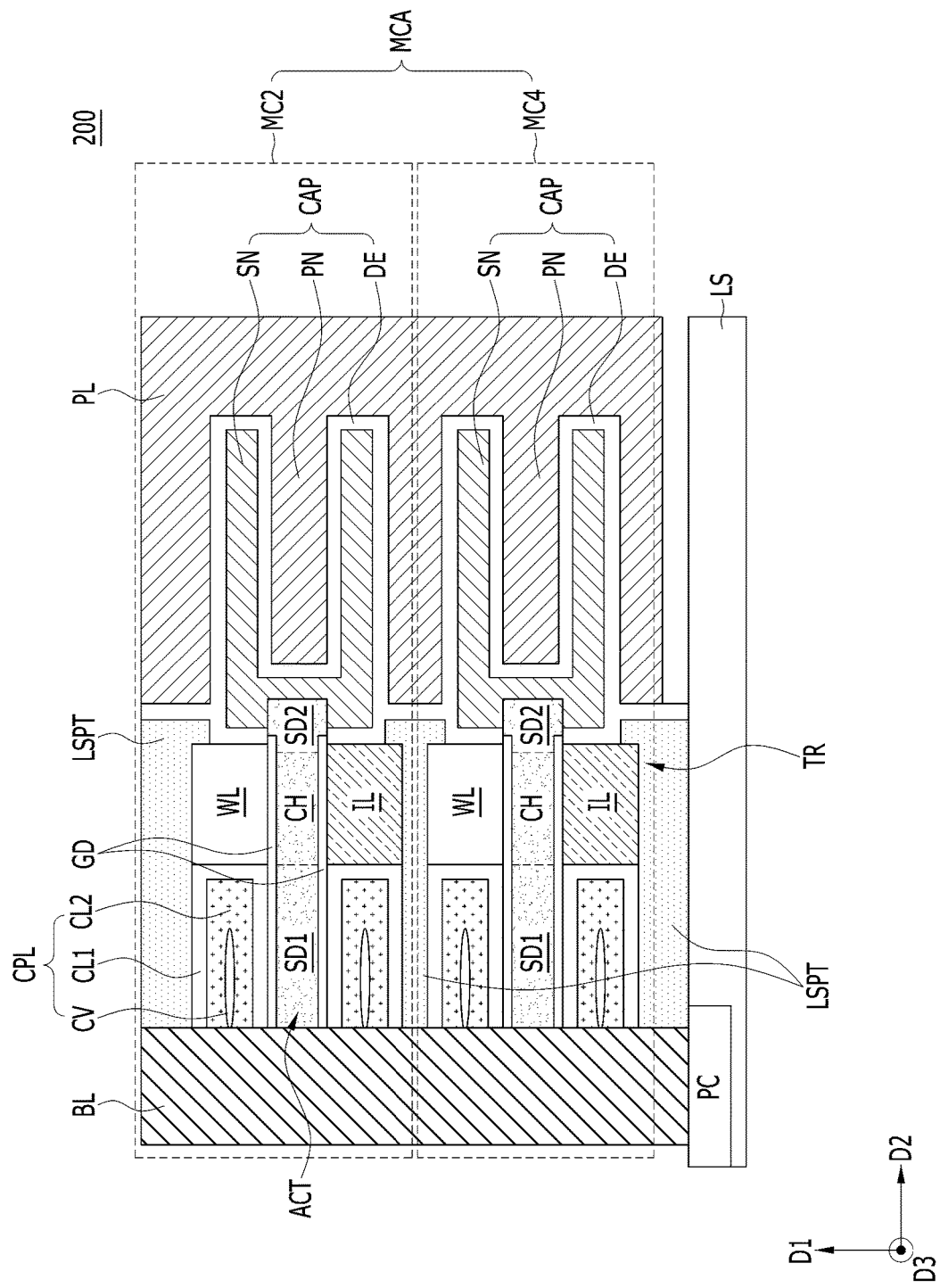

FIGS. 4A and 4B are views illustrating a semiconductor device according to an embodiment of the present disclosure. FIG. 4A is a perspective view illustrating a semiconductor device, and FIG. 4B is a cross-sectional view schematically illustrating a semiconductor device. In FIGS. 4A and 4B, the same reference numbers are used to denote the same elements as those in FIGS. 1A to 1D. Referring to FIGS. 4A and 4B, a semiconductor device 200 may be similar to the semiconductor device 100 of FIGS. 1A to 1D. No detailed description is given for duplicate elements. Although not shown, the layout view of the semiconductor device 200 may be similar to that of FIG. 1B.

The semiconductor device 200 may include a base substrate LS. A memory cell array MCA may be formed on the base substrate LS. The memory cell array MCA may be vertically oriented from the base substrate LS along the first direction D1. The memory cell array MCA may include a plurality of memory cells MC, and the memory cells MC may be vertically oriented along the first direction D1. The individual memory cells MC1, MC2, MC3, and MC4 may include a bit line BL, a transistor TR, a capacitor CAP, and a plate line PL. The transistor TR and the capacitor CAP may be horizontally oriented along a second direction D2. The individual memory cells MC1, MC2, MC3, and MC4 may further include a word line WL, and the word line WL may be elongated along the third direction D3. In the individual memory cells MC1, MC2, MC3, and MC4, the bit line BL, the transistor TR, the capacitor CAP, and the plate line PL may be positioned horizontally along the second direction D2. The memory cell array MCA may include a dynamic random-access memory (DRAM) memory cell array.

The memory cell array MCA may include a stack of at least two or more memory cells MC. The memory cells MC may be vertically stacked on the base substrate LS along the first direction D1.

The transistor TR may include an active layer ACT and a word line WL. The transistor TR may be positioned between the bit line BL and the capacitor CAP. The transistors TR may be horizontally arranged (LA) along the second direction D2 parallel with the surface of the base substrate LS. For example, the transistor TR may be horizontally positioned between the bit line BL and the capacitor CAP.

The word line WL may extend in the third direction D3, and the active layer ACT may extend in the second direction D2. The third direction D3 may be perpendicular to the first direction D1. The active layers ACT may be horizontally arranged from the bit line BL.

The word line WL may have a single word line structure positioned on the top surface of the active layer ACT. The gate dielectric layers GD may be formed on the surfaces of the active layer ACT. The word line WL may be disposed on the top surface of the active layer ACT, and an insulation layer IL may be disposed under the bottom surface of the active layer ACT. The gate dielectric layer GD may be formed between the word line WL and the top surface of the active layer ACT. The gate dielectric layer GD may also be formed between the insulation layer IL and the bottom surface of the active layer ACT. The word line WL may include a metal, a metal mixture, a metal alloy, or a semiconductor material. The gate dielectric layer GD may include silicon oxide, silicon nitride, high-k material, ferroelectric material, antiferroelectric material, or a combination thereof. The insulation layer IL may block interference of the word lines WL between the memory cells MC positioned vertically along the first direction D1. The insulation layer IL may be a structure resultant from replacing the lower word line WLL of FIG. 1C with an insulation material.

In the instant embodiment, a capping layer CPL may be positioned between the bit line BL and the word line WL. The capping layer CPL may be oriented along the second direction D2 between the bit line BL and the word line WL. The capping layer CPL may include a first liner material CL1, a second liner material CL2, and a seam CV. The capping layer CPL may be positioned at the same level as the word line WL. The capping layer CPL may be horizontally positioned between the bit line BL and the insulation layer IL. The capping layers CPL may face each other along the first direction D1, with the active layer ACT disposed therebetween.

The second liner material CL2 may include a seam CV or a void. The seam CV of the second liner material CL2 may be positioned to be physically spaced apart from the word line WL. The seam CV may directly contact the bit line BL.

As described above, the bit line BL and the word line WL may be physically spaced apart from each other by the capping layer CPL. A sufficient physical distance may be secured between the seam CV and the word line WL by the second liner material CL2. Further, since the lateral migration of the seam CV along the second direction D2 is suppressed by the second liner material CL2. Thus, punching of the word line WL may be prevented by the capping layer CPL.

According to an embodiment, the seam CV may remain an embedded air gap. Thus, since the capping layer CPL includes the embedded air gap, the parasitic capacitance between the bit line BL and the word line WL may be reduced. Since the second liner material CL2 includes a low dielectric constant, the parasitic capacitance between the bit line BL and the word line WL may further be reduced.

Alternatively, the insulation layer IL may be replaced with the capping layer CPL. For example, the insulation layer IL may be omitted, and the capping layer CPL positioned under the active layer ACT may horizontally extend.

According to an embodiment, the semiconductor device 200, similar to the semiconductor device 100' of FIG. 3, may have the memory cell array MCA positioned under the base substrate LS.

Figure 5A:
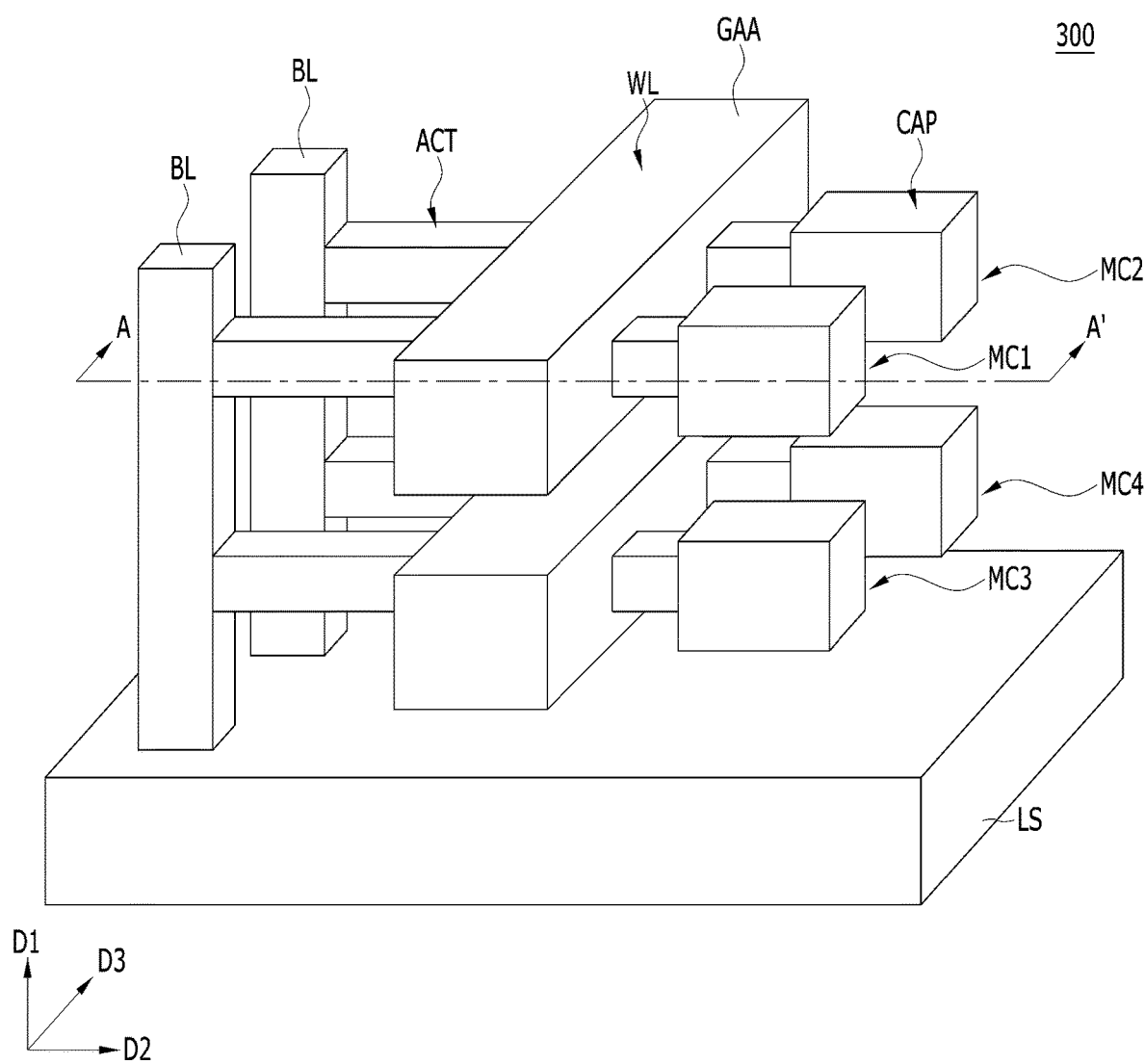
FIGS. 5A and 5B are views illustrating a semiconductor device according to an embodiment of the present disclosure.
Figure 5B:
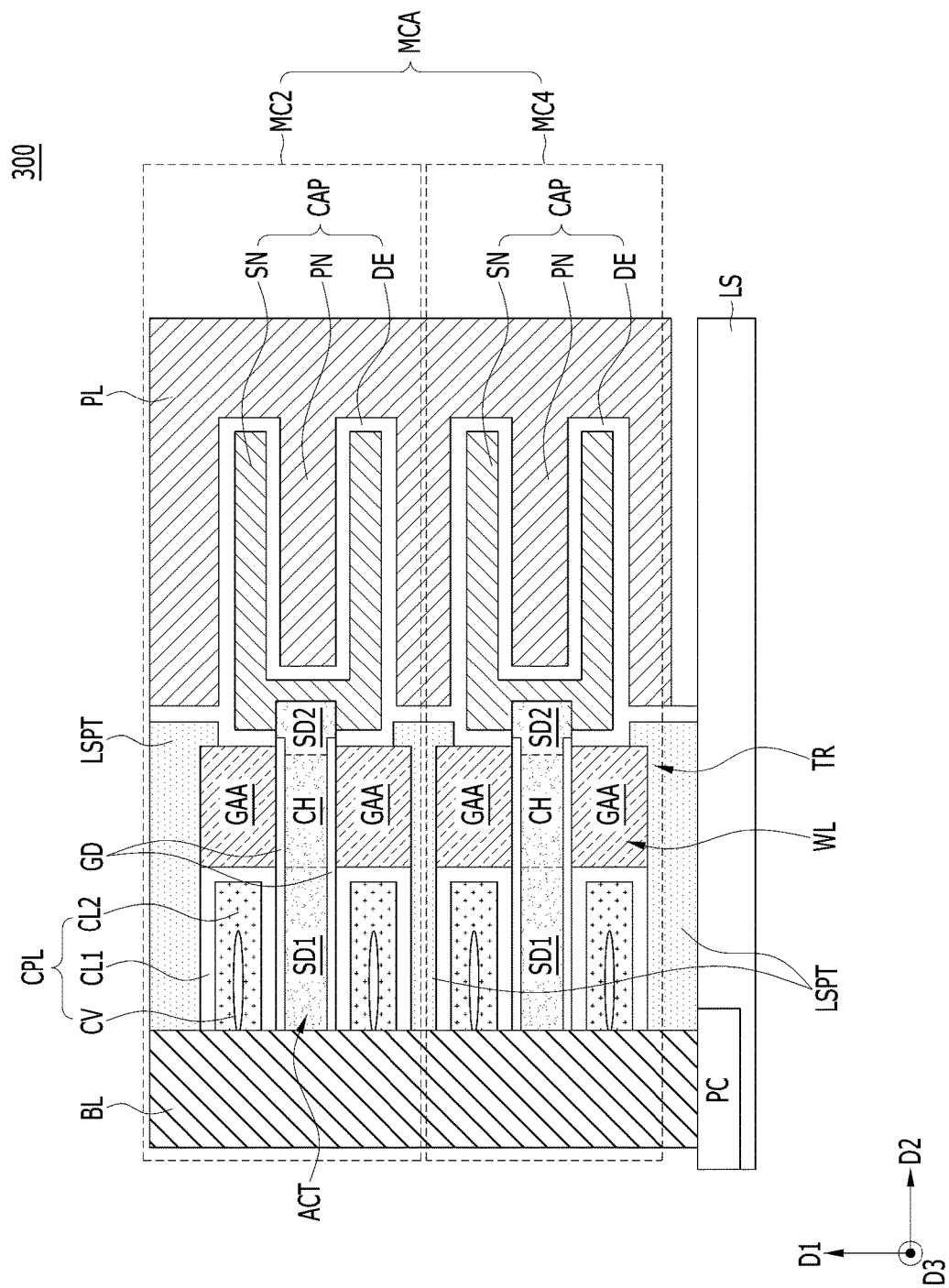

FIGS. 5A and 5B are views illustrating a semiconductor device according to an embodiment of the present disclosure. FIG. 5A is a perspective view illustrating a semiconductor device, and FIG. 5B is a cross-sectional view schematically illustrating a semiconductor device. In FIGS. 5A and 5B, the same reference numbers are used to denote the same elements as those in FIGS. 1A to 1D. Referring to FIGS. 5A and 5B, a semiconductor device 300 may be similar to the semiconductor device 100 of FIGS. 1A to 1D. No detailed description is given for duplicate elements. Although not shown, the layout view of the semiconductor device 300 may be similar to that of FIG. 1B.

The semiconductor device 300 may include a base substrate LS, and a memory cell array MCA may be formed on the base substrate LS. The memory cell array MCA may be vertically oriented from the base substrate LS along the first direction D1. The memory cell array MCA may include a plurality of memory cells MC, and the memory cells MC may be vertically oriented along the first direction D1. The individual memory cells MC1, MC2, MC3, and MC4 may include a bit line BL, a transistor TR, a capacitor CAP, and a plate line PL. The transistor TR and the capacitor CAP may be horizontally oriented along a second direction D2. The individual memory cells MC1, MC2, MC3, and MC4 may further include a word line WL, and the word line WL may be elongated along the third direction D3. In the individual memory cells MC1, MC2, MC3, and MC4, the bit line BL, the transistor TR, the capacitor CAP, and the plate line PL may be positioned horizontally along the second direction D2. The memory cell array MCA may include a dynamic random-access memory (DRAM) memory cell array.

The memory cell array MCA may include a stack of at least two or more memory cells MC. The memory cells MC may be vertically stacked on the base substrate LS along the first direction D1.

The transistor TR may include an active layer ACT and a word line WL. The transistor TR may be positioned between the bit line BL and the capacitor CAP. The transistors TR may be horizontally arranged (LA) along the second direction D2 parallel with the surface of the base substrate LS. For example, the transistor TR may be horizontally positioned between the bit line BL and the capacitor CAP.

The word line WL may extend in the third direction D3, and the active layer ACT may extend in the second direction D2. The third direction D3 may be perpendicular to the first direction D1. The active layers ACT may be horizontally arranged from the bit line BL.

The word line WL may have a gate-all-around (GAA) structure that surrounds the active layer ACT. Gate dielectric layers GD may be formed on the surfaces of the active layer ACT, and the word line WL may surround the gate dielectric layers GD. The word line WL may include a metal, a metal mixture, a metal alloy, or a semiconductor material. The gate dielectric layer GD may include silicon oxide, silicon nitride, high-k material, ferroelectric material, antiferroelectric material, or a combination thereof. The vertical support VSPT may block interference of the word lines WL positioned vertically.

In the instant embodiment, a capping layer CPL may be positioned between the bit line BL and the word line WL. The capping layer CPL may be oriented along the second direction D2 between the bit line BL and the word line WL. The capping layer CPL may include a first liner material CL1, a second liner material CL2, and a seam CV. The capping layer CPL may be positioned at the same level as the word line WL. The capping layers CPL may face each other along the first direction D1, with the active layer ACT disposed therebetween.

The second liner material CL2 may include a seam CV or a void. The seam CV of the second liner material CL2 may be positioned to be physically spaced apart from the word line WL. The seam CV may directly contact the bit line BL.

As described above, the bit line BL and the word line WL may be physically spaced apart from each other by the capping layer CPL. A sufficient physical distance may be secured between the seam CV and the word line WL by the second liner material CL2. Further, since the lateral migration of the seam CV along the second direction D2 is suppressed by the second liner material CL2, punching of the word line WL may be prevented.

According to an embodiment, the seam CV may remain an embedded air gap. Thus, since the capping layer CPL includes the embedded air gap, the parasitic capacitance between the bit line BL and the word line WL may be reduced. Since the second liner material CL2 includes a low dielectric constant, the parasitic capacitance between the bit line BL and the word line WL may further be reduced.

According to an embodiment, the semiconductor device 300, similar to the semiconductor device 100' of FIG. 3, may have the memory cell array MCA positioned under the base substrate LS.

One of ordinary skill in the art will recognize that the semiconductor devices according to various embodiments of the disclosure as described above are not limited to the above-described embodiments and those shown in the drawings, and various changes, modifications, or alterations may be made thereto without departing from the scope of the disclosure.

Although various embodiments have been described for illustrative purposes, it will be apparent to those skilled in the art that various changes and modifications may be made without departing from the spirit and scope of the disclosure as defined in the following claims.

What is claimed is:

1. A semiconductor device, comprising:
    a plurality of memory cells vertically stacked on a base substrate;
    each of the plurality of memory cells includes:
    a bit line vertically oriented from the base substrate;
    a capacitor horizontally spaced apart from the bit line;
    an active layer horizontally oriented between the bit line and the capacitor, the active layer including a first source/drain region connected to the bit line and a second source/drain region connected to the capacitor;
    a word line horizontally extending in a direction crossing the active layer; and
    a capping layer positioned between the word line and the bit line, and including, at least one of a low-k material and an air gap,
    wherein the capacitor includes a cylinder shape storage node horizontally oriented from the active layer and connected to the second source/drain region,
    wherein a portion of the second source/drain region is extended to an outer surface of the cylinder shape storage node, and the outer surface of the cylinder shape storage node covers upper and lower surfaces of the portion of the second source/drain, and
    wherein the air gap disposed at a same horizontal level as the word line.

2. The semiconductor device of claim 1, wherein the capping layer is horizontally oriented between the bit line and the word line.

3. The semiconductor device of claim 1, wherein the capping layer includes:
    a first liner material between the bit line and the word line; and
    a second liner material surrounded by the first liner material and including the low-k material.

4. The semiconductor device of claim 3, wherein the low-k material includes a material with an etch selectivity to the first liner material.

5. The semiconductor device of claim 3, wherein the low-k material includes a carbon-doped material, and wherein the first liner material includes silicon oxide or silicon nitride.

6. The semiconductor device of claim 3, wherein the low-k material includes silicon carbide (SiC), silicon carbon nitride (SiCN), or silicon carbon oxide (SiCO).

7. The semiconductor device of claim 1, wherein the air gap is physically spaced apart from the word line and is embedded in the capping layer.

8. The semiconductor device of claim 7, wherein the air gap directly contacts the bit line.

9. The semiconductor device of claim 1, wherein the base substrate includes a peripheral circuit unit connected to the bit line.

10. The semiconductor device of claim 1, wherein the bit line is part of the active layer, and the capacitor is part of a dynamic random access memory (DRAM) cell array.

11. The semiconductor device of claim 1, wherein the capacitor further includes:
    a dielectric layer on the cylinder shape storage node; and
    a plate node on the dielectric layer.

12. The semiconductor device of claim 1, wherein the word line includes:
    an upper word line positioned on the top surface of the active layer; and
    a lower word line positioned under the bottom surface of the active layer, and wherein different potentials are applied to the upper word line and the lower word line.

13. The semiconductor device of claim 1, wherein the word line includes a single word line positioned on the top surface of the active layer, and wherein
    the semiconductor device further comprises an insulation layer facing the single word line and positioned under the bottom surface of the active layer.

14. The semiconductor device of claim 1, wherein the word line includes a gate-all-around structure to surround the active layer, and wherein the word line with the gate-all-around structure is elongated in a direction crossing the active layer.

15. The semiconductor device of claim 1, wherein the memory cells are vertically stacked upwards from the base substrate.

16. The semiconductor device of claim 1, wherein the memory cells are vertically stacked downwards from the base substrate.

17. The semiconductor device of claim 1, further comprising:
- a vertical support supporting the active layers of the memory cells along a direction in which the memory cells are stacked; and
- a horizontal support positioned between the memory cells along the direction in which the memory cells are stacked.

18. The semiconductor device of claim 1, wherein the word line includes:
- a body portion elongated in a direction crossing the active layer; and
- an extension portion horizontally protruding to the capping layer from both side surfaces of the body portion.

19. The semiconductor device of claim 1, comprising a three-dimensional (3D) array of the memory cells.

20. The semiconductor device of claim 1, wherein the capping layer includes:
- a first liner material including the low-k material positioned between the bit line and the word line; and
- a second liner material surrounded by the first liner material and including the air gap which is embedded.

21. The semiconductor device of claim 20, wherein the low-k material includes a carbon-containing material, and the second liner material includes silicon oxide or silicon nitride.

22. The semiconductor device of claim 20, wherein the low-k material includes silicon carbide (SiC), silicon carbon nitride (SiCN), or silicon carbon oxide (SiCO).

23. A semiconductor device, comprising:
- a base substrate including a peripheral circuit unit;
- a bit line vertically oriented from the base substrate;
- a word line spaced apart from the bit line and the base substrate and horizontally extending in a direction crossing the bit line;
- a capping layer including an air gap positioned between the word line and the bit line;
- a capacitor horizontally spaced apart from the bit line; and
- an active layer horizontally oriented between the bit line and the capacitor, the active layer including a first source/drain region connected to the bit line and a second source/drain region connected to the capacitor,
- wherein the air gap disposed at a same horizontal level as the word line,
- wherein the capacitor includes a cylinder shape storage node horizontally oriented from the active layer and connected to the second source/drain region,
- wherein a portion of the second source/drain region is extended to an outer surface of the cylinder shape storage node, and,
- wherein the outer surface of the cylinder shape storage node covers upper and lower surfaces of the portion of the second source/drain.

24. The semiconductor device of claim 23, wherein the capping layer includes a low-k material.

25. The semiconductor device of claim 23, wherein the capping layer includes carbon-doped silicon oxide or carbon-doped silicon nitride.

26. The semiconductor device of claim 23, wherein the capping layer includes:
- a first liner material positioned between the bit line and the word line; and
- a second liner material including the air gap,
- wherein the first liner material is shaped to surround a portion of the second liner material.

27. The semiconductor device of claim 26, wherein the second liner material contacts the bit line but does not contact the word line.

28. The semiconductor device of claim 26, wherein the second liner material includes a carbon-containing material with a low dielectric constant, and wherein the first liner material includes silicon oxide or silicon nitride.

29. The semiconductor device of claim 26, wherein the second liner material includes silicon carbide (SiC), silicon carbon nitride (SiCN), or silicon carbon oxide (SiCO).

* * * * *